US012761325B2

(12) United States Patent
Satyan et al.

(10) Patent No.: US 12,761,325 B2
(45) Date of Patent: Oct. 13, 2026

(54) LASER TRANSMITTER COMPONENT, LIGHT DETECTION AND RANGING SYSTEM, AND COMPUTER READABLE MEDIUM

(71) Applicant: Intel Corporation, Santa Clara, CA (US)

(72) Inventors: Naresh Satyan, Pasadena, CA (US); George Rakuljic, Santa Monica, CA (US); Yaakov Vilenchik, Menlo Park, CA (US); Israel Petronius, Haifa (IL)

(73) Assignee: Intel Corporation, Santa Clara, CA (US)

( * ) Notice: Subject to any disclaimer, the term of this patent is extended or adjusted under 35 U.S.C. 154(b) by 907 days.

(21) Appl. No.: 18/165,949

(22) Filed: Feb. 8, 2023

(65) Prior Publication Data

US 2023/0314570 A1 Oct. 5, 2023

Related U.S. Application Data

(63) Continuation of application No. PCT/US2022/022701, filed on Mar. 31, 2022.

(51) Int. Cl.

*G01S 7/481* (2006.01)
*H01S 5/024* (2006.01)
*H01S 5/06* (2006.01)

(52) U.S. Cl.

CPC .......... *G01S 7/4815* (2013.01); *G01S 7/4817* (2013.01); *H01S 5/02453* (2013.01); *H01S 5/0612* (2013.01)

(58) Field of Classification Search

None

See application file for complete search history.

(56) References Cited

U.S. PATENT DOCUMENTS 6,501,773 B1 * 12/2002 Volz ...................... H01S 5/0687 372/29.01
2003/0095736 A1 * 5/2003 Kish, Jr. ............. H01S 5/02415 385/37

(Continued)

OTHER PUBLICATIONS

Evalueserve, Patentability Search Report, "Co-packaged wavelengthselectable multielement laser array with optical isolators for coherent LIDAR", Dec. 17, 2021, 14 pages (for informational purposes only).

(Continued)

*Primary Examiner* — Luke D Ratcliffe

(74) *Attorney, Agent, or Firm* — Viering, Jentschura & Partner mbB

(57) ABSTRACT

A laser transmitter component including a photonic integrated circuit substrate including a plurality of laser transmitters coupled to at least one optical output, and configured to emit a light beam from one of the laser transmitters of the plurality of laser transmitters through the at least one optical output one laser transmitter at a time; a feedback circuit configured to determine at least one characteristic of the light beam emitted from the optical output and to provide the determined characteristic to a controller; and the controller configured to control at least one of a temperature and an input electrical current of the laser transmitter emitting the light beam and to control at least one of a temperature and an input electrical current of at least one further laser transmitter of the laser transmitter component based on the determined characteristic.

18 Claims, 9 Drawing Sheets

(56) References Cited

U.S. PATENT DOCUMENTS

| | | | | |
|---|---|---|---|---|
| 2005/0025420 | A1 | 2/2005 | Farr | |
| 2011/0216794 | A1 | 9/2011 | Howard et al. | |
| 2017/0279246 | A1 | 9/2017 | Muendel | |
| 2017/0307736 | A1 * | 10/2017 | Donovan | G01S 7/497 |
| 2018/0188371 | A1 | 7/2018 | Bao et al. | |
| 2019/0052063 | A1 | 2/2019 | Tolstikhin | |
| 2021/0336415 | A1 | 10/2021 | Chen et al. | |

OTHER PUBLICATIONS

International Search Report issued for the corresponding International patent application No. PCT/US2022/022701, dated Dec. 27, 2022, 3 pages (for informational purposes only).

* cited by examiner

LASER TRANSMITTER COMPONENT, LIGHT DETECTION AND RANGING SYSTEM, AND COMPUTER READABLE MEDIUM

CROSS-REFERENCE TO RELATED APPLICATIONS

This application claims priority to PCT/US2022/022701, filed on Mar. 3, 2022, the entire contents of which are hereby incorporated by reference.

TECHNICAL FIELD

This disclosure generally relates to the field of light detection and ranging systems.

BACKGROUND

A multi-wavelength coherent light detection and ranging (LIDAR) system requires multiple transmitter wavelengths to be chosen in a dynamic manner. In addition, the frequency of each laser of the LIDAR system has to be controlled in a precise manner (e.g., a linear frequency sweep) in order to obtain LIDAR range and velocity information.

However, laser arrays developed for communication applications may not meet the wavelength, linewidth, stability, power and functional safety requirements of automotive LIDAR applications. In particular, when lasers are integrated into an array, their optical frequency sweeping for LIDAR applications are affected by modulation crosstalk, thermal crosstalk, and other impairments which require new innovations.

In a related LIDAR system with individually packaged lasers of different wavelengths, each laser needs optical isolation and temperature control. This makes the packaging of the laser the dominant contribution to the laser cost, and the LIDAR system with multiple packages is not cost effective and scalable.

Another related LIDAR system with a smaller number of tunable lasers has the disadvantage that fast wavelength switching and wavelength control are required, making it a more complicated and expensive LIDAR system.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which.

DESCRIPTION

Figure 1:
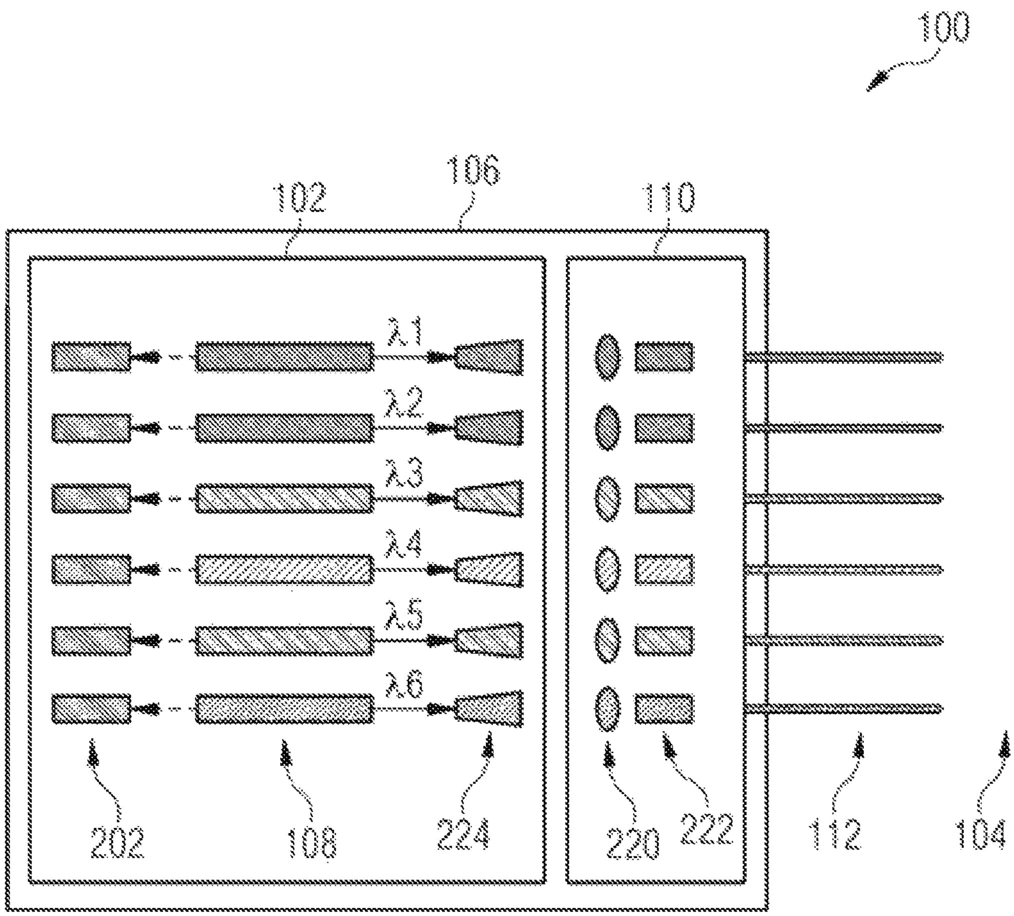
FIG. 1 illustrates a schematic diagram of a LIDAR system.

The following detailed description refers to the accompanying drawings that show, by way of illustration, specific details and aspects in which the invention may be practiced.

The term "as an example" is used herein to mean "serving as an example, instance, or illustration". Any aspect or design described herein as "as an example" is not necessarily to be construed as preferred or advantageous over other aspects or designs.

Throughout this specification, a LIDAR system may be understood as a device configured to implement LIDAR sensing, and may include various components to carry out light emission, light detection, and data processing. A LIDAR system may include a laser transmitter (e.g., a laser source) and emitter optics (also denoted as optical components) to direct light into a field of view (FOV) of the LIDAR system (also denoted as scene of the LIDAR system), and may include receiver optics and a receiver (e.g. a photodetector) to collect and detect light from the field of view. The LIDAR system may further include a processing circuit configured to determine spatial information associated with the field of view of the LIDAR system based on the emitted light and the received light (e.g., the processing circuit may be configured to determine various properties of an object in the field of view based on the light that the LIDAR system emits and that the object reflects back towards the LIDAR system). Alternatively, or in addition, the LIDAR system may be communicatively coupled with a processing circuit external to the LIDAR system, e.g. with a cloud-based processing circuit. As examples, the processing circuit may be configured to determine the distance of an object from the LIDAR system, the shape of the object, the dimensions of the object, and/or the like. The LIDAR system may further include one or more additional components to enhance or assist the LIDAR sensing, such as, only as examples, a gyroscope, a camera, an accelerometer, a Global Positioning System (GPS) device, and/or the like. A LIDAR system may also be referred to herein as LIDAR device, LIDAR module, LIDAR means, or LIDAR apparatus.

Coherent light detection and ranging (LIDAR) systems may detect depth and velocity information. Coherent LIDAR systems may require the generation of precise frequency-swept waveforms. Frequency-swept waveforms may include linear frequency chirps where the optical frequency varies linearly with time. However, other chirp shapes are possible. Coherent LIDAR systems may also require very low phase fluctuations in the optical beam. Phase fluctuations may also be denoted as laser linewidth. The implementation of laser arrays on a chip where lasers are situated in close proximity leads to the presence of crosstalk or interference between different components on the chip.

The light detection and ranging (LIDAR) system includes an array of laser emitters. Each laser emitter of the laser emitter array can be tuned to a particular operating wavelength. Each laser emitter of the laser emitter array can be packaged in a single package with a global temperature control element. Each laser emitter of the laser emitter array may include an optical isolator to protect the lasers from harmful back reflections.

A controller of the LIDAR system may select an optical output of one laser emitter of the laser emitter array by a switching mechanism. The switching mechanism may be a semiconductor optical amplifier (SOA), for example. The SOA can provide gain in the ON state and absorption in the OFF state.

The LIDAR system may further include a means to provide a frequency sweep on the optical output. The frequency sweep means may include an algorithm that jointly controls the drive currents into multiple lasers. Alternatively, or in addition, frequency sweep means may include an external modulator that is capable of generating frequency sweeps as the input wavelength is changed at high speeds. The LIDAR system enables three-dimensional (3D) imaging and velocity measurements for autonomous vehicle applications. The controller of the LIDAR system reduces costs in the sensor, e.g. in the laser transmitter, opens new market segments and delivers an improved value proposition to autonomous vehicle customers.

The LIDAR system may be a multi-wavelength laser transmitter for long-range coherent LIDAR applications. The LIDAR system includes a number of optical wavelength channels (lasers) with precise control of the individual lasing wavelengths. This way, using the transmitter in a coherent LIDAR system, optical water absorption requirements and efficient coverage of the LIDAR field of view (FOV) is considered. The LIDAR system may include narrow linewidth coherent lasers, rapid switching between the lasing wavelengths (e.g. switching times well below 1 μs), and/or precise linear chirp of the lasers.

The LIDAR system having a wavelength-switchable laser array (WSLA) provides a cost effective solution. Here, the LIDAR system having WSLA integrates a number of narrow linewidth lasers on a single photonic integrated circuit (PIC).

The LIDAR system supports optical isolators to address back reflections into the laser path.

Figure 3:
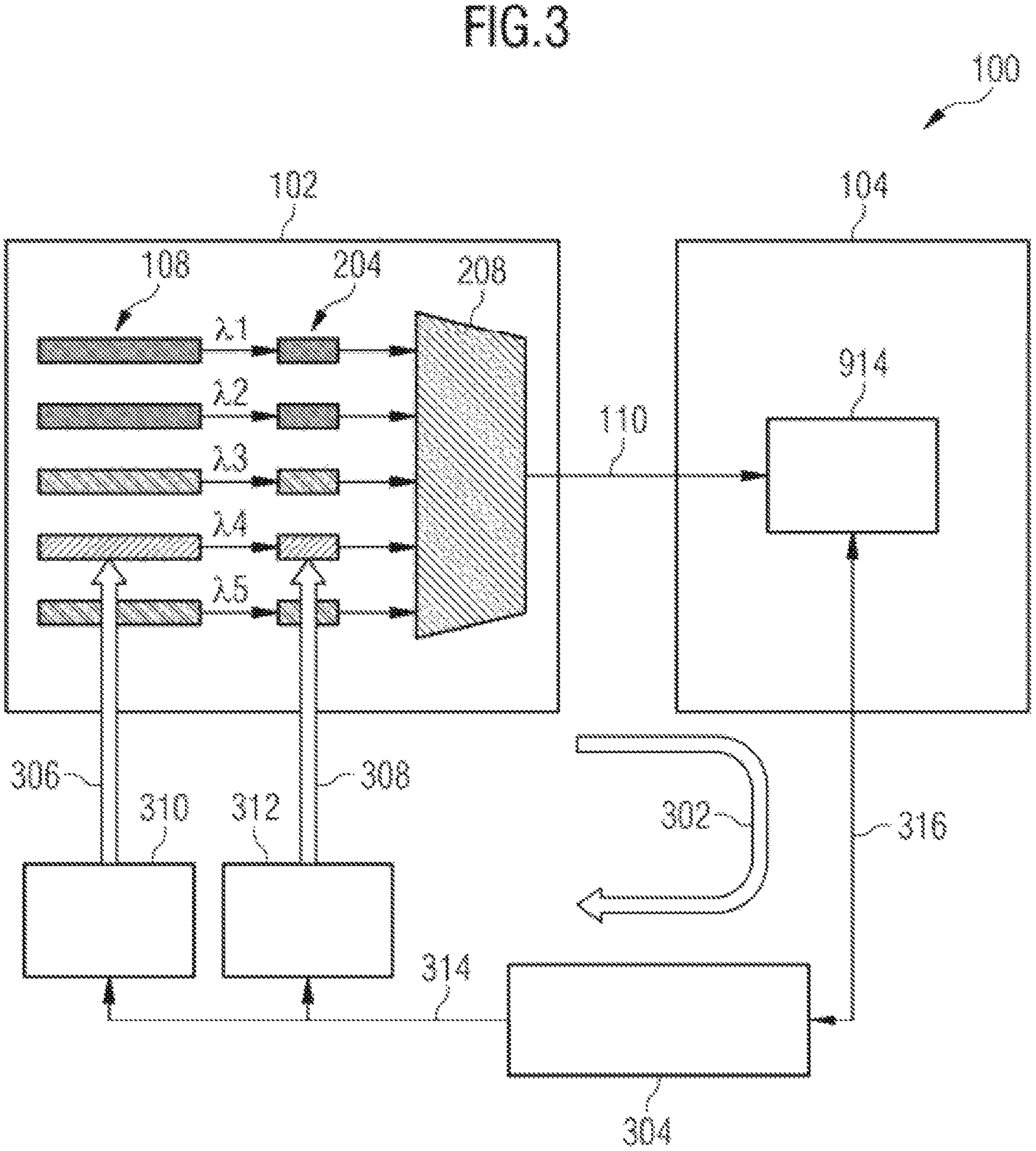
FIG. 3 illustrates a schematic diagram of a LIDAR system.

The WSLA provides lasers supporting stringent linewidth requirement. Hence, the integration of various electro-optical components may be performed in a way that the laser linewidth is not degraded. The LIDAR system may include optical ON/OFF switches with low gain as illustrated in FIG. 1. Alternatively, or in addition, the LIDAR system may include a external modulator that provides optical isolation from back reflections, as illustrated in FIG. 3.

The LIDAR system may provide exact tuning of the laser wavelengths by at least one of control of the lithographic process used to fabricate the lasers, individual thermal heaters to separately control each laser's wavelength, and fine tuning the bias controls to change the laser wavelength.

The LIDAR system provides frequency chirping of the laser achieved by a controller controlling the laser bias currents to produce a required output frequency vs. time waveform, or by using an external modulator. Further, the controller ensures linear chirps for all N operating wavelengths by a feedback circuit as described in more detail below.

Further, the instructions of the controller of the LIDAR system may be based on thermal simulations of the lasers and experiments that correspond to thermal crosstalk between different lasers and other optical components. Further, the layout of the photonic circuit may include results of thermal simulations that correspond to thermal crosstalk between different lasers and other optical components to avoid or reduce thermal crosstalk.

FIG. 1 is a schematic diagram of a LIDAR system 100. The LIDAR system 100 may be in a single package. The LIDAR system 100 may include, e.g. on a photonic integrated circuit (PIC) substrate 106, a laser component 102 optically coupled to an optical component system 104 (see also FIG. 9).

The laser transmitter component 102 may include a photonic integrated circuit (PIC) substrate 106, may be formed thereon, or may be integrated therein. In the laser component 102, laser transmitters 108 (more than one laser) may be arranged on the same photonic chip situated in close proximity to other laser transmitters 108 of the laser component 102 and other active optical components, e.g. optical amplifiers.

In FIG. 1, the optical component system 104 is coupled to the laser component 102 via a fiber array unit (FAU) including an optical fiber (in FIG. 1 illustrated as solid line per laser transmitter 108) optically coupling the light beams 112 emitted from the laser transmitters 108 with the optical component system 104.

The laser transmitter component 102 may include a plurality of laser transmitters 108 coupled to at least one optical output 110. The laser transmitter component 102 may be configured to emit a light beam 112 from one of the laser transmitters 108 of the plurality of laser transmitters 108 through the at least one optical output 110 one at a time. In other words, only one laser transmitter 108 emits a light beam 112 into the scene from the LIDAR system 100 at a time. This way, energy density of the emitted light beam 112 can be limited, e.g. to provide an eye safety provision for the LIDAR system 100. When used with laser transmitters of different wavelengths e.g. A1, A2, A3, A4, A5, A6, and a dispersive optical element, e.g. a grating as part of the optical component system 104, emitting light from only one transmitter 108 at a time provides a means to interrogate different parts of the target scene one at a time.

In other words, the LIDAR system 100 may include an array 102 of laser transmitters (also denoted as laser transmitter component 102 or laser array 102). Each laser transmitter 108 of the laser transmitter array 102 can work at a different wavelength at the operating temperature of the laser array 102. Each of the illustrated laser transmitters 108 may be configured or controlled to emit light of individual wavelength A1, A2, A3, A4, A5, A6.

A multi-wavelength LIDAR architecture may require precise control of individual laser wavelengths of the laser transmitters 108. The laser transmitter array 102 may be arranged on a single photonic integrated circuit (PIC) 106. Alternatively, or in addition, the laser transmitters 108 or the laser array 102 may be individual laser transmitters 108 on sub-mounts. Wavelengths of the laser transmitters 108 of the laser array 102 may be optimized for the LIDAR application, e.g. based on requirements to avoid atmospheric absorption and scattering of light emitted from the lasers. This way, the LIDAR system achieves good coverage of the LIDAR field of view (also denoted as point cloud). The laser transmitters 108 may be designed for narrow linewidth. A narrow linewidth may be less than 100 kHz, e.g. less than <10 kHz, regarding the frequency of the peak of the light emitted from a laser transmitter 108. The peak frequency may be an instantaneous frequency as the frequency may change with time. Thus, the linewidth is narrow at any instant of time. This way, the LIDAR system provides improved long-range LIDAR measurements.

The laser component 102 may include monitoring photo diodes (MPD) 202 for measuring the power of each laser transmitter 108. This way, driving of the laser transmitters 108 can be coarsely adjusted. The controller having the feedback circuit, as described in more detail below, may increase the adjustment of the driving of the laser transmitters 108. In addition, the controller may maintain a narrow linewidth of individual laser transmitters 108 when the laser transmitter 108 is part of the laser array 102 and in dynamic operation.

The laser transmitters 108 may be coupled to an optical output 110 through an edge inverted taper (EIT) 224 of a waveguide and optical isolators 220, 222, e.g. a second optical isolator coupled to a fiber optics and a first optical isolator 220, and a first optical isolator 220 further coupled to the EIT 224. The optical isolators 220, 222 may be prevent an optical feedback into the laser transmitter 108 from the outside, and may thus prevent a damage of the laser transmitters 108. In other words, the optical isolators 220, 222 may protect the laser transmitters 108 from harmful back reflections directed into the laser transmitter 108 from the outside.

The LIDAR system may further include a single temperature control element, e.g. a thermoelectric cooler (TEC), coupled to the PIC substrate 106 that may control a common temperature of the entire laser component. The TEC may also control the temperature of various other optical components and optical isolators of the LIDAR system. The temperature control may be configured to adjust the temperature for the entire laser array 102 (also denoted as global temperature control). As an example, a thermal packaging of individual laser transmitters 108 may otherwise add a large cost to the package.

The controller of the LIDAR system using the feedback circuit provides narrow linewidth and wavelength control across the entire laser array 102 at high yield, e.g. under conditions where laser transmitters 108 and optical switches 204 may be arranged in close proximity to each other. The wavelength of the laser transmitters 108 of the laser array 102 can be tuned by one or more of a lithographic tuning (e.g., by choosing different grating periods in the different laser transmitters 108 of the laser array 102), a thermal tuning (e.g., by using micro-heaters in the vicinity of each laser transmitter in order to only change the wavelength of one laser transmitter per heater), and an electronic tuning (e.g., by laser transmitter input current).

The optical output(s) 110 of the laser array may be frequency-swept with the output optical frequency (frequencies) varying with a precisely controlled frequency vs. time characteristic. The controller including the feedback circuit directly modulates the laser transmitters 108 (illustrated in more detail in FIG. 3) or may use an external modulation (illustrated in more detail in FIG. 5).

Figure 2:
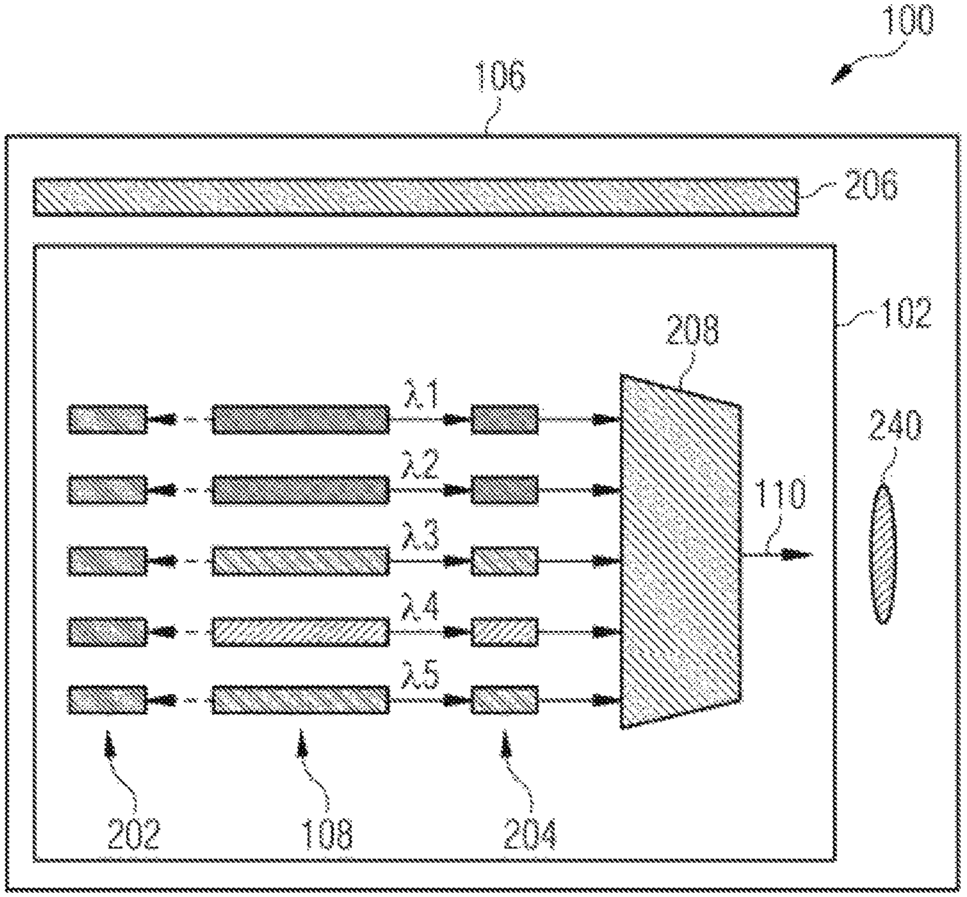
FIG. 2 illustrates a schematic diagram of a LIDAR system.

FIG. 2 is a schematic diagram of a LIDAR system 100 illustrating further details and alternatives to the LIDAR system 100 illustrated in FIG. 1.

A wirebond pad area 206 may be formed on or integrated in the PIC substrate 106 adjacent to the laser array 102. The wirebond pad area 206 may be electrically coupled to the laser transmitter 108 and further electrical components, e.g. the optical switches (see also FIG. 6).

Alternatively, or in addition, to the laser PIC using the FAU, the laser array 102 may be configured as a co-packaged wavelength-switchable laser array (WSLA). In other words, the LIDAR system illustrated in FIG. 1 may be based on a silicon photonics packaging technology. In the silicon photonics packaging technology, multiple optical waveguide outputs 110 may be coupled to multiple optical fibers using edge inverted tapers (EIT) on the PIC, lens arrays attached to the PIC, and bulk optical isolators and FAUs to couple the light into optical fibers. The LIDAR system may be a silicon photonics platform with integrated lasers, or on a III-V or other semiconductor platform. Temperature control requirements on two chips may be different when coupling multiple optical beams from one photonic chip to another chip.

Alternatively, or in addition, to the FAU, the laser array 102 may be coupled to the optical component system of the LIDAR system 100 using a free space micro-optics, or a silicon optical bench, e.g. using a lens 240 as shown in FIG. 2. The PIC 106 may be packaged on a ceramic carrier on a thermoelectric cooler. The coupling lens 240 may be used to couple the optical output 110 into an optical fiber or other optical components. An optical isolator may be used after the coupling lens (not illustrated).

Thus, the LIDAR system 100 may include a single optical output (also denoted as coupling point) between the laser array 102 and the optical component system (also denoted as optical circuits). The single coupling point may be achieved by switching the laser transmitters 108 ON and OFF sequentially. This way, one laser may be ON at a time. The sequentially switched laser couple light into a single output 110. An ON/OFF switch may be at least one of a SOA 204 and a variable optical attenuator (VOA). An optical coupler to provide a single optical output having multiple optical inputs may be at least one of a broadband passive combiner 208 and a wavelength multiplexer. In a wavelength multiplexer, the inputs to the multiplexer correspond to the wavelength of the corresponding laser channel. As an example, a wavelength multiplexer may include an arrayed waveguide grating.

The controller having the feedback circuit may bias the ON/OFF switches, e.g. in case of SOAs 204 as ON/OFF switches, that they may be transparent or provide optical gain in the ON state, and absorb light in the OFF state. The controller may provide injection current in the forward state and a reverse bias circuit in the OFF state. The reverse bias circuit applies a negative voltage to the SOA 204. The controller switches the SOA 204 between the ON state and the OFF state at high speeds. An example of an SOA switching circuit of the controller may be illustrated in FIG. 6. The SOA switching circuit includes an H-bridge. The H-bridge circuit 600 uses forward biasing 608 and reverse biasing 616 of diodes for high-speed switching of optical amplifiers.

Figure 6:
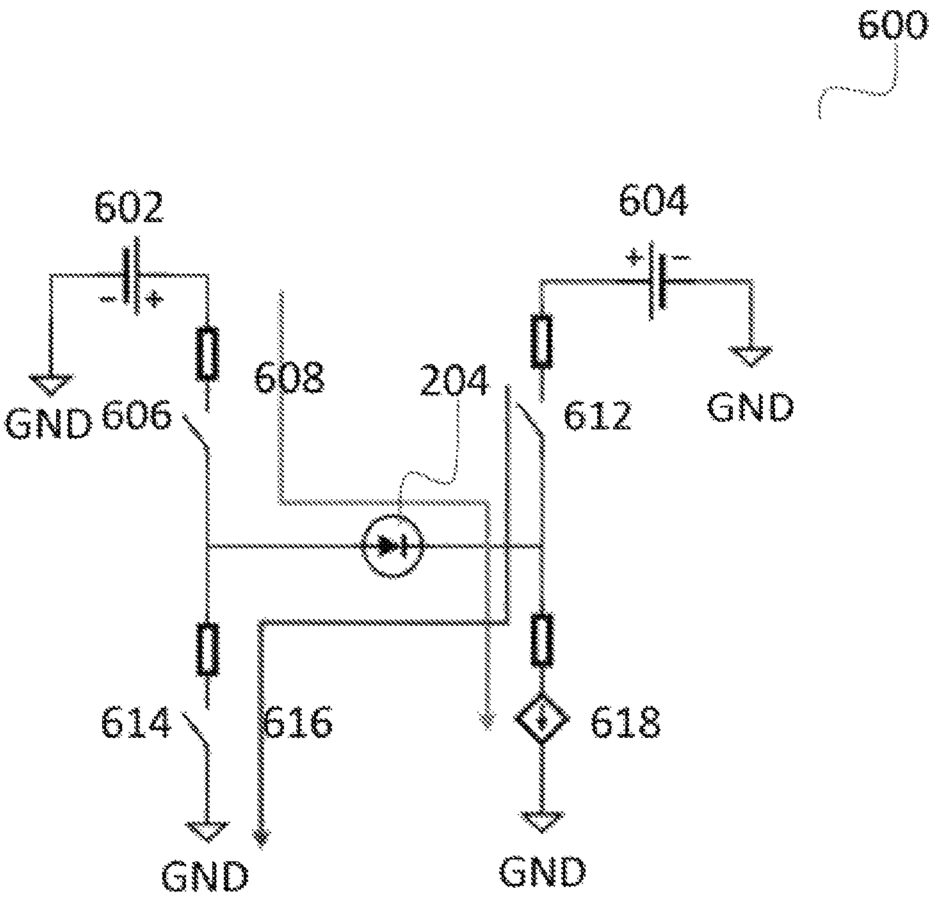
FIG. 6 illustrates a circuit diagram of an optical switch of a laser transmitter of a LIDAR system.

In the H-bridge illustrated in FIG. 6, bias current for the SOA 204 may be controlled using controllable bias sources 602, 604 and a configurable bias current source 618. The synchronized switches 606, 612, 614 may be turned ON and OFF so that the SOA 204 may be forward biased 608 when the optical channel is ON, e.g. the laser transmitter emits a light beam to the scene. Synchronized switches may be turned ON and OFF so that the SOA reverse biased 616 to the right extent when the optical channel is OFF, e.g. the laser transmitter is not supposed to emit a light beam to the scene. The LIDAR system 100 may include an H-bridge circuit 600 for each SOA 204. However, the switches 606, 612, 614 per bias path 608, 616 may be of inverted conductivity, e.g. self-conducting transistor vs. self-locking transistor, having a common electrical potential at the control terminal, e.g. gate or base electrode. The switches 606, 612, 614 across all the SOA circuits 600 may be synchronized so that only one optical channel of the laser array 102 may be active at a time in the WSLA.

In a coherent LIDAR system, laser transmitters 108 have a frequency swept output. The frequency swept output can be realized by sweeping the frequencies of the individual laser transmitters 108, e.g. by changing their bias currents accordingly and control the frequency vs. time characteristic of the laser transmitters 108.

As an example, in a directly modulated laser (DML) array 102, a current modulation may be applied to each laser transmitter 108 of the laser array 102. The current modulation generates a frequency chirp. Currents switched into the optical switches 204 may be switched with very short (also denoted as high speed) rise and fall times.

In close packaging of the laser transmitters 108 in the laser array 102, electrical crosstalk may occur between the different modulation currents and switching currents. This may impact the frequency chirp of any individual laser transmitter 108 of the laser array 102. Further, as optical active devices may be situated in close proximity and generate heat, they may have a direct effect on the temperature, and hence the optical frequency, of other laser transmitters 108 on the laser array 102. Optical active devices may be laser transmitters 102, SOA 204, etc. The interference dynamically effects changes with time, and introduces laser phase noise (also denoted as linewidth) and chirp non-idealities. The controller having the feedback circuit compensates these crosstalk and interference effects. FIG. 3 illustrates a feedback circuit 302 of the controller 304 in a DML array of a LIDAR system. The controller 304 including the feedback circuit 302 determines and compensates complex non-idealities.

As illustrated in FIG. 3, the LIDAR system 100 includes a plurality of optical channels each channel corresponding to a wavelength A1, A2, A3, A4, A5 of a laser transmitter. The temperature of the laser transmitters 108 and the electrical currents input to the laser transmitters 108 may be set in a calibration step.

Figure 9:
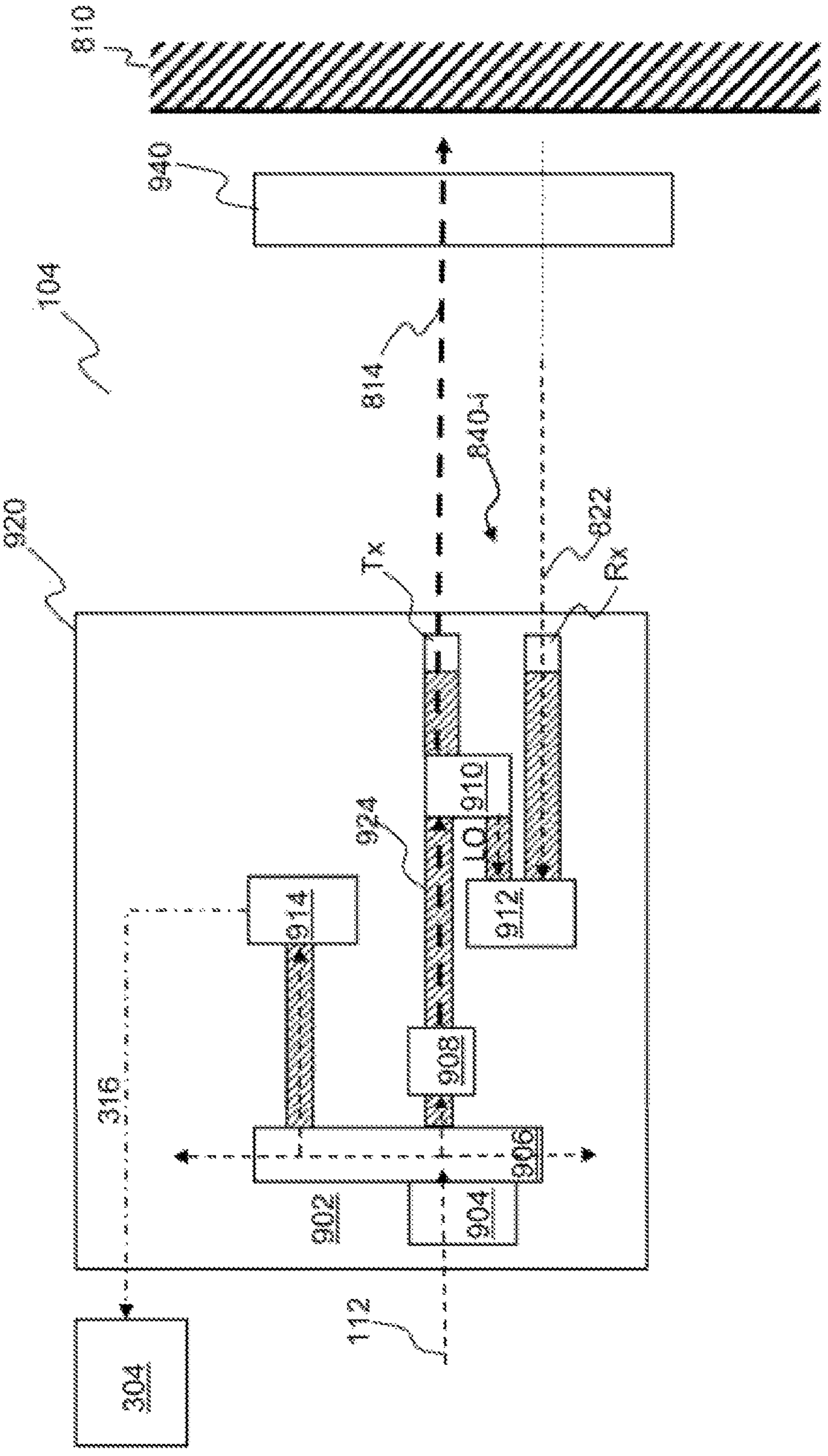
FIG. 9 illustrates a schematic diagram of an example of an optical component system of a LIDAR system.

The feedback circuit 302 may include a measurement of phase noise and chirp linearity using an optical frequency discriminator 914 (see also FIG. 9). The optical frequency discriminator 914 may be an asymmetric Mach Zehnder Interferometer (MZI) coupled to a (balanced) photodetector. The optical frequency discriminator 914 may include an optical amplifier, a delay line, and/or a Michelson interferometer. The optical frequency discriminator 914 may be optically isolated from the optical channels coupled to the scene of the LIDAR system 100. This way, the optical frequency discriminator 914 may be independent from the light reflected from the scene of the LIDAR system. Alternatively, the optical frequency discriminator 914 may be integrated in one of the optical channels coupled to the scene of the LIDAR system.

The measurements are synchronized 316 the timing of laser transmitter(s) 108 and optical switch(es) 204. The controller 304 provides timing signals, e.g. STROBE, and correction signals 314 to the driver 310 of the laser transmitter(s) 108 (also denoted as laser driver 310) and the driver 312 of the optical switch(es) 204 (also denoted as switch driver 312). The laser driver 310 provides N modulation waveforms with N being the number of laser transmitters 108 (one per laser transmitter 108). The switch driver 312 provides N switching waveforms with N being the number of laser transmitters 108. The Switching waveforms select one optical channel ON at a time (the N−1 optical channels are OFF).

The LIDAR system includes a memory having instructions stored therein that when executed by a processor, e.g. by the controller 304 or a processor of the controller 304, causes the controller 304 to:

set a laser array temperature and bias currents as per wavelength calibration step, set individual laser modulation waveforms to nominal values that generate approximately correct frequency chirp waveforms, couple the optical output of the LIDAR system into a chirp and phase noise monitoring system of the LIDAR system. The monitoring system 914 may be the optical frequency discriminator 914 illustrated in FIG. 9, e.g. a delayed self-heterodyne interferometer or other optical frequency discriminator. The monitoring system may be implemented as part of the LIDAR system, e.g. integrated therein, e.g. integrated on the same chip.

turn on the wavelength switching sequence to the operational sequence. For example, turn on a first optical amplifier SOA 204 for 10 µs (e.g. for 0 to 10 µs of a timeline) with other optical channels of the LIDAR system switched OFF. Then, the controller 304 switches on a second optical amplifier SOA 240 from 10-20 µs of the timeline, etc. This way, the controller 304 generates an electro-thermal interference pattern that may be present in normal course of operation.

measure the optical frequency vs. time profile and phase fluctuations of a particular channel of the plurality of optical cannels during the time that the particular optical switch may be switched ON. As an example, measure a first optical channel of the plurality of optical channels during 0 to 10 µs, measure a second optical channel of the plurality of optical channels from 10-20 µs and so on, e.g. for each optical channel of the plurality of optical channels in operation.

simultaneously adjust a subset or all N individual laser current modulation waveforms 306 to reduce the error in a predetermined frequency chirp, and cancel the phase fluctuations (e.g. reduce phase noise and/or narrow the linewidth) both inherent to the laser as well as those introduced by thermal and electrical crosstalk of the other laser transmitters.

The feedback circuit 302 may implement serial and/or parallel multi-input multi-output (MIMO) control. The controller 304 measures the optical frequency versus time profile and phase fluctuations of one laser transmitter at a time. The controller 304 uses the determined error signal to change the drive currents of the particular laser currently in use as well as all the other (N−1) laser transmitters 108 of the subset of laser transmitters 108 or the plurality of lasers. This way, by repetition of the measure the optical frequency vs. time profile and phase fluctuations of a particular channel of the plurality of optical cannels during the time that the particular optical switch may be switched ON, and simultaneously adjust a subset or all N individual laser current modulation waveforms 306 to reduce the error in a predetermined frequency chirp, and cancel the phase fluctuations both inherent to the laser as well as those introduced by thermal and electrical crosstalk of the other laser transmitters, a desired frequency chirp and linewidth can be achieved.

The feedback circuit 302 may be run in real time, or as a state machine that may be updated on each iteration of the loop. Several different algorithms may be used to compute the requisite modulation waveforms in the simultaneous adjustment of a subset or all N individual laser current modulation waveforms to reduce the error in a predetermined frequency chirp, and cancel the phase fluctuations both inherent to the laser as well as those introduced by thermal and electrical crosstalk of the other laser transmitters. Examples may be hill climber algorithms, gradient descent algorithms and others. The algorithms may be deterministic or stochastic. The feedback circuit may be in operation throughout the life of the LIDAR system 100.

Figure 4:
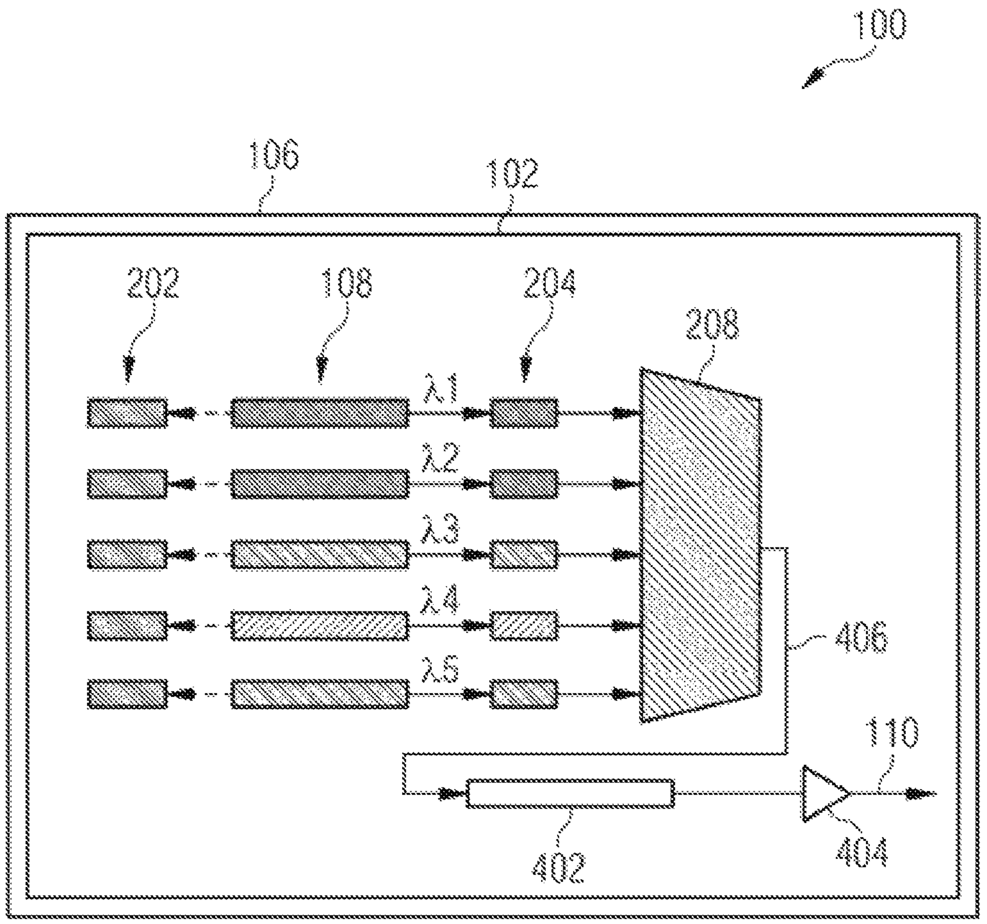
FIG. 4 illustrates a schematic diagram of a LIDAR system.

Alternatively to the DML illustrated in FIG. 2 and FIG. 3, the laser transmitters 108 may operate at a fixed wavelength and an external frequency modulator may be used to sweep the optical frequency. This method may be also denoted as externally modulated laser (EML), and may be illustrated in FIG. 4 and FIG. 5. In the EML, at least one of an I/Q modulator and suppressed-carrier single sideband modulator (SC-SSB modulator) 402 may be used to minimize unwanted frequencies at the optical output 110.

In the EML, laser transmitters 108 can operate at a fixed current. The fixed current enables very stable and low-noise laser transmitters 108 on a semiconductor PIC. In the EML, the LIDAR system 100 may include a co-packaged WSLA based on a laser transmitter PIC. The external modulator 402 may be used to generate a clean swept-frequency optical waveform at the optical output 110. An SOA 404 coupled to the output of the external modulator 402 may obtain a predetermined power level at the optical output 110.

In a LIDAR system having an EML WSLA, the modulator 402 switches the ON/OFF switches 204 so that the input light to the modulator 402 is switched to different wavelengths at rapid speed. Rapid speed can be as short as about 10 μs ON time per wavelength or shorter. For example, the LIDAR system 100 may have a single modulator 402 coupled to combined laser outputs 208, e.g. instead of one modulator per laser (also denoted as single modulator LIDAR system). This way cost may be reduced as high-speed modulators can be expensive components. In the single modulator LIDAR system, the modulator imparts a frequency sweep on the optical beam, e.g. a linear frequency chirp. An EML may require a high-speed (RF) frequency-swept waveform, and the modulator converts the RF waveform to an optical waveform in a 1:1 manner.

Figure 5:
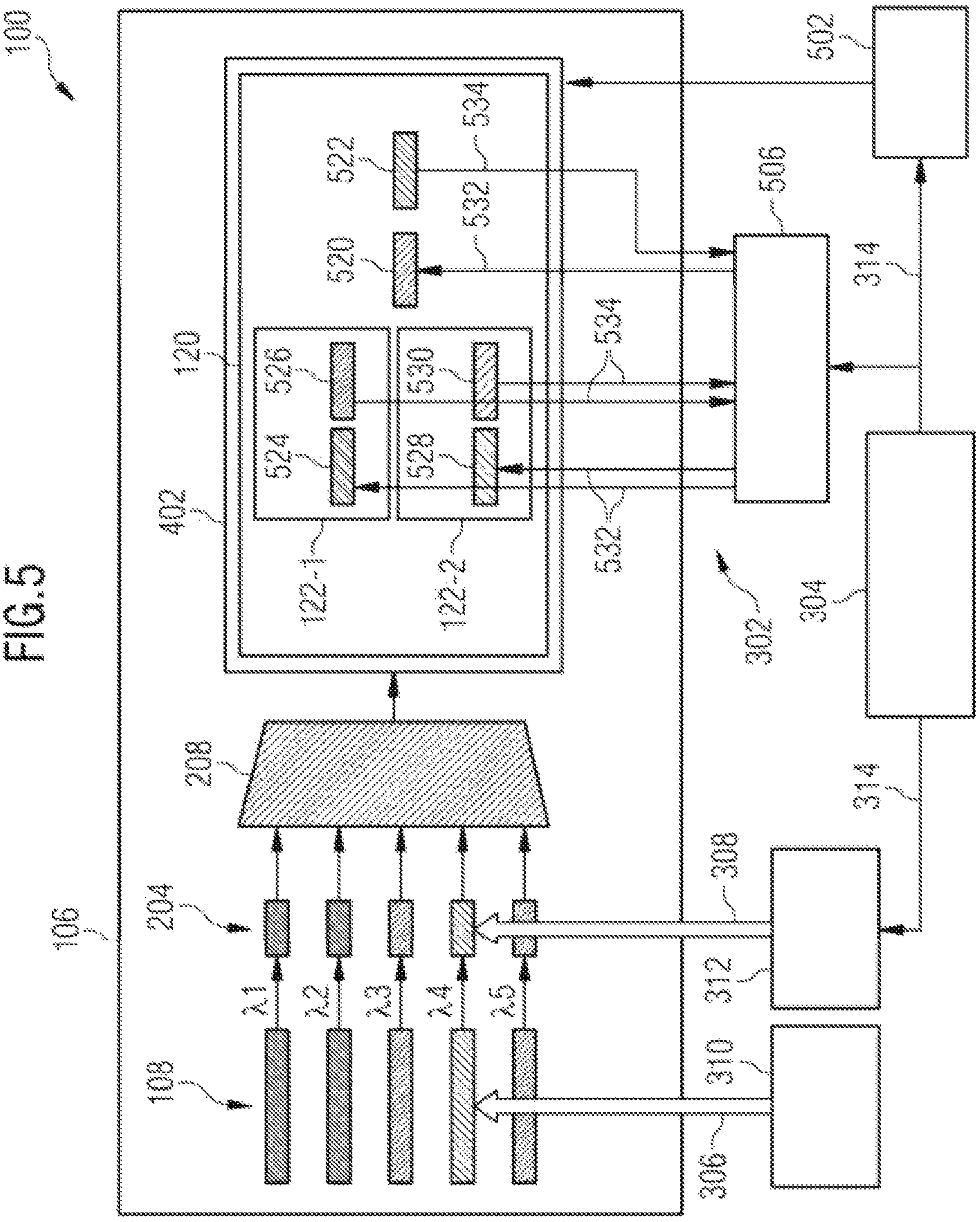
FIG. 5 illustrates a schematic diagram of a LIDAR system.

A suppressed-carrier single sideband (SC-SSB) optical frequency modulator 402 as single modulator may be configured as a nested Mach-Zehnder structure, as illustrated in FIG. 5. In the nested Mach-Zehnder structure 402, a first "child" Mach-Zehnder modulator 122-1 and a second "child" Mach-Zehnder modulator 122-2 may be nested within a "parent" Mach Zehnder interferometer 120. A bias 524, 528 of the respective child interferometers 122-1, 122-2 and the bias 520 of the parent interferometer 120 may be set precisely. This way, the SC-SSB modulator 402 achieves a required suppression of unwanted frequencies at the optical output of the SC-SSB modulator, e.g. a large spur-free dynamic range.

The controller 304 may provide timing signals 314 to the drivers 310, 312, a modulator bias controller 506 and a chirp function 502. The bias points of the interferometers 122-1, 122-2, 120 may be set by injecting 532 a series of "pilot tones" into the bias sources 524, 528, 520 of the modulator 402. The controller 304 monitors 534 pilot tone frequencies at different points in the modulator 402 synchronized to the timing signals 314 using photodiodes 526, 530, 522. The controller 304 adjusts the bias points of the modulator 402 to minimize the signals pilot tone frequencies at various points in the modulator.

Pilot tone frequencies may be very low, typically about 1 kHz, to account for slow changes in modulator bias points. The modulator 402 operates at high frequencies of 100 MHz to 10s of GHz. This way, pilot tones do not interfere with the optical frequencies at the optical output.

In the single modulator LIDAR system, the input to the modulator may be switched at relatively high speeds, e.g. with dwell times of about 10 μs per optical channel. In other words, a different wavelength may be incident on the modulator input every about 10 μs. The bias points may be a function of frequency, and therefore the bias may be adjusted as the wavelength may be switched. The switching speed of 10 μs may be shorter than a pilot tone period of about 1 ms. Here, the controller 304 of the LIDAR system may perform the optimization based on measurements performed when the modulator operates at the same wavelength.

Thus, the controller 304 may be configured for MIMO feedback circuit 302 to bias an SSB modulator 402 in a externally modulated laser architecture for coherent LIDAR. The feedback circuit 302 may be configured for rapid switching of laser wavelengths. FIG. 5 illustrates only a part of the building blocks of the LIDAR system.

FIG. 5 illustrates an array of laser transmitters 108 followed by ON/OFF switches 204. However, the modulator bias feedback circuit 302 technique may also apply to any other switched optical input, e.g. a tunable laser.

In FIG. 5, the LIDAR system includes N wavelength channels, switched from 1:N periodically, with an ON time T per channel. After a time NT, the sequence repeats again. A STROBE signal 314 may be used to switch between wavelength channels (N=5).

The controller 304 injects the desired pilot tone frequencies into the single modulator 402, e.g. the SC-SSB modulator. Typically the period of the pilot tone may be large compared to T.

The controller 304 monitors 534 the pilot tone signals at various points in the SC-SSB modulator, synchronized to a STROBE signal. This results in a set of measurements which may be sampled with sample interval NT. As an example, measurement series 1 (m1): measured at times t=(0, NT, 2NT, 3NT . . . ), measurement series 1 (m2): measured at times t=(T, (N+1)T, (2N+1)T, (3N+1)T . . . ), . . . , and measurement series N (mN): measured at times t=((N−1)T, (2N−1)T, (3N−1)T, (4N−1)T . . . ).

An offset time 6T<T can be added to each measurement. The controller 304 sets the bias points of the modulator to minimize the series of measurements. This way, the bias points set during period 1 (0 to T) correspond to the minimizing of measurements m1, the bias points set during period 2 (T to 2T) correspond to the minimizing of measurements m2, etc. The bias points set during period N ((N−1)T to NT) may minimize the measurements mN. The controller 304 may repeat the described feedback circuit 302, e.g. one or two times or more often, over the lifetime of the LIDAR system.

The controller 304 may perform the bias point optimization based on one of the sets of measurements m1 through mN if the modulator is designed to be sufficiently wavelength-agnostic, e.g., the bias points to achieve the required spur-free dynamic range may be only a weak function of the optical wavelength.

Further, the illustrated feedback circuit 302 may also be applicable when an external modulator approach is used with a single tunable laser that switches to multiple wavelengths, e.g. instead of an array of laser transmitters 108 with external switches.

Illustratively, the controller 304 may measure the monitor current 534 during a time a predetermined optical switch 204 corresponding to a laser transmitter 108 is switched ON and sets a corresponding bias input 532.

Figure 7:
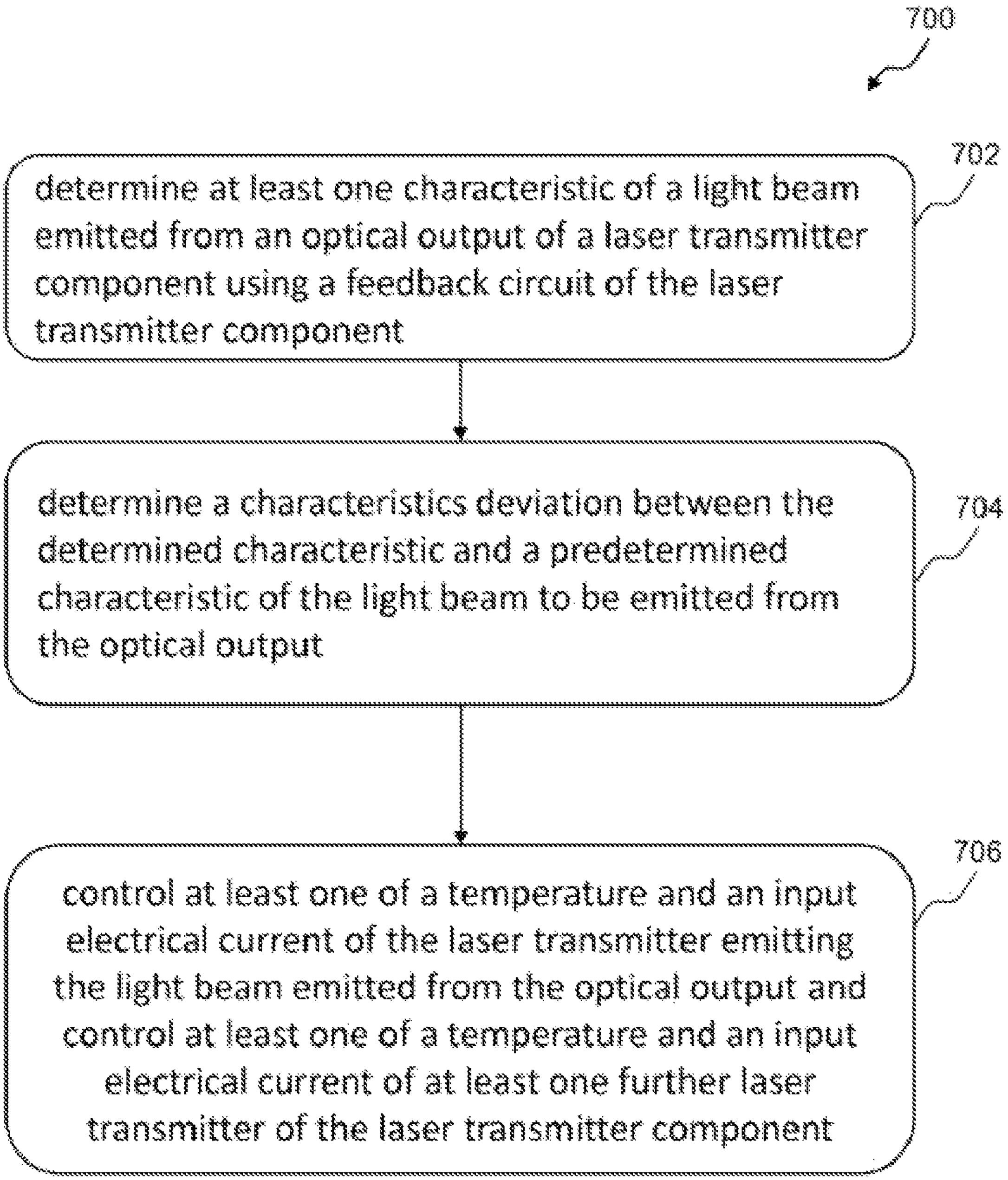
FIG. 7 illustrates a flow diagram of a method to operate a LIDAR system.

FIG. 7 illustrates a flow diagram of a method to operate a LIDAR system. The LIDAR system may be configured according to an above-described example.

The method 700 may include determining 702 at least one characteristic of a light beam emitted from an optical output of a laser transmitter component using a feedback circuit of the laser transmitter component The method 700 may further include determining 704 a characteristics deviation between the determined characteristic and a predefined characteristic, The method 700 may further include controlling 706 at least one of a temperature and an input electrical current of the laser transmitter emitting the light beam emitted from the optical output based on the determined characteristics deviation, and controlling at least one of a temperature and an input electrical current of at least one further laser transmitter of the laser transmitter component based on the determined characteristic corresponding to a predetermined characteristic of the light beam to be emitted from the optical output.

Figure 8:
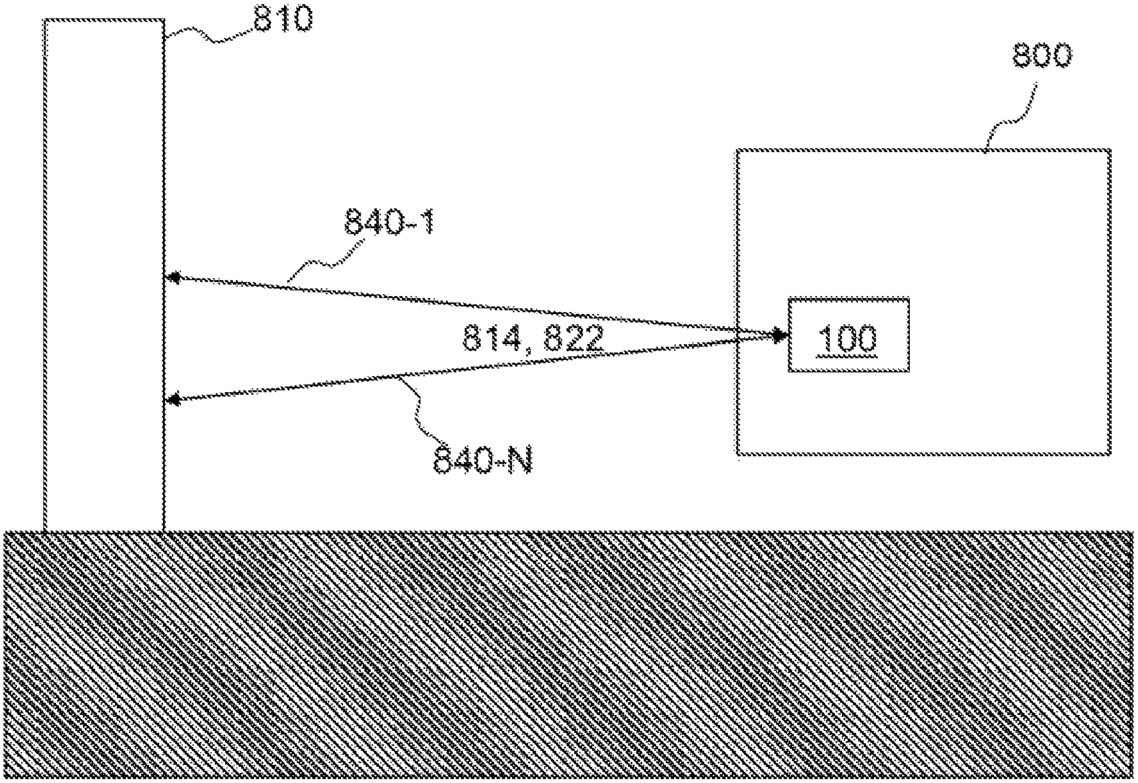
FIG. 8 illustrates a schematic diagram of a vehicle having a LIDAR system.

FIG. 8 illustrates a schematic diagram of a vehicle 800 having a LIDAR system 100 integrated therein, as an example. The vehicle 800 may be an unmanned/autonomous vehicle, e.g. unmanned/autonomous aerial vehicle, unmanned/autonomous automobile, or autonomous robot. In addition, the LIDAR system 100 may be used in a mobile device such as a smartphone or tablet. In a vehicle 800, the LIDAR system 100 may be used to control the direction of travel of the vehicle 800. Alternatively, or in addition, the LIDAR system 100 may be configured for obstacle detection, object depth detection or velocity detection outside of the LIDAR system 100 (also denoted as the scene of the LIDAR system 100), as an example. Alternatively, or in addition, the vehicle 800 may require a driver or teleoperator to control the direction of travel of the vehicle 800. Here, the LIDAR system 100 may be a driving assistant. As an example, the LIDAR system 100 may be configured for obstacle detection, e.g. determining a distance and/or direction and relative velocity of an obstacle (target 110) outside of the vehicle 800. The LIDAR system 100 may be configured, along one or more optical channels 840-*i* (with i being one between 1 to N and N being the number of channels of the PIC), to emit light 814 from one or more outputs (also denoted as Rx) of the LIDAR system 100, e.g. outputs of the light paths, and to receive light 822 reflected from the target 810 in one or more light inputs (also denoted as Tx) of the LIDAR system 100. The structure and design of the outputs and inputs of the light paths of the LIDAR system 100 may vary depending on the working principle of the LIDAR system 100.

Alternatively, the LIDAR system 100 may be or may be part of a spectrometer or microscope. However, the working principle may be the same as in a vehicle 800.

FIG. 9 illustrates a schematic diagram of an example of the optical component system 104 of the LIDAR system 100. The LIDAR system 100 may include a PIC 920 on a PIC substrate 902, e.g. a semiconductor substrate, e.g. a silicon-based substrate.

The PIC substrate 902 may be made of a semiconductor material, e.g. silicon. The PIC 920 may be a common substrate, e.g. at least for a plurality of optical channels 840-*i* (see also FIG. 8). The term "integrated therein" may be understood as formed from the material of the substrate and, thus, may be different to the case in which elements are formed, arranged or positioned on top of a substrate. The term "located next" may be interpreted as formed in or on the same (a common) PIC substrate 902.

Each optical channel (also denoted as light path) 840-*i* of the plurality of optical channels 840-N may include at least one optical output interface Tx configured to output the amplified light from the PIC 920. Each light path of the plurality of optical channels 840-N may include at least one photodetector 912 configured to receive light 822 from the outside of the PIC 920. The at least one photodetector 912 may be located next to the at least one light optical output interface Tx, e.g. integrated in the common PIC substrate 902. The at least one light optical output interface Tx and the at least one photodetector 912 may be arranged on the same side of the PIC substrate 902.

The at least one photodetector 912 may include a photodiode and a beam combining structure (also denoted as optical combiner, optical beam combiner or optical mixer). The beam combining structure is configured to merge at least two individual beams, e.g. a local oscillator (LO) and light from the optical input interface Rx of the PIC 920, to a single beam. The output of the beam combining structure may effectively be optically split, e.g. into two individual beams, in case a balanced photodiode pair is used (not illustrated).

One or more optical channels 840-*i* of the LIDAR system 100 may include further optical components 940, e.g. a scan mirror (also denoted as scanning mirror) in the light path between a grating structure and the outside of the LIDAR system 100. The grating structure may be a transmission grating, a reflective grating, or a grism. The grating structure may be optically arranged to guide light from the optical output interface Tx of the PIC 920 to the outside of the LIDAR system 100 and from the outside of the LIDAR system 100 to the photodetector 912. The optical components 940 may also include a lens or a lens array (further denoted as lens) that may be arranged between the PIC 920 and the grating structure. The lens may be any one of a converging lens, a collimating lens or a diverging lens.

Using a multiple (M) wavelength laser transmitting component 102 as described above and the grating structure, the number of optical channels may be increased by a factor of M for a given PIC 920 to achieve a desired high number (>100) of vertical resolution elements or pixels.

The one or more optical output interfaces Tx may emit electromagnetic radiation, e.g. ultra-violet light, visible light, infrared radiation, terahertz radiation or microwave radiation (denoted as "light" throughout this specification) to different parts of the scene of the LIDAR system 100, e.g. at the same time or subsequently, e.g. by the grating structure and/or the lens along one or more optical channels 840-*i*. The electromagnetic radiation may include a continuous wave and/or pulsed, e.g. a frequency modulated continuous wave (FMCW) in which the frequency of the received light is swept or chirped. This way, light 814 emitted by the optical output interface Tx of the PIC 920 samples different portions of a target 810 (not the same pixel) and/or different targets 810 at the same time. Thus, light reflected 822 from the target 810 and detected by a photodetector 912 of different optical channels 840-*i* contains information correlated to different portions of a target 810 (not the same pixel) and/or different targets 810 at the same time. In other words, a plurality of optical channels 840-N emit light into different directions in space using the grating. The target back reflects light 822 to the optical input interface Rx. This way, a mapping between the emitted light 814 and the information of the target may be enabled from the returned light 822.

The LIDAR system 100 may include a plurality of laser transmitters (also denoted as (coherent) electromagnetic radiation source) each configured to emit light 814 having a wavelength/frequency different to the wavelength/frequency of the other laser transmitters. The PIC substrate 902 may have integrated therein at least one light receiving input 904 and at least one optical splitter 906 to branch light received at the at least one light receiving input 904 to one of one or more optical channels 840-*i*. The laser transmitter provides the light 112 to the optical input structure 904 of the PIC 920.

A part of the incoming light 112 is guided to phase noise monitoring system 914, e.g. the optical discriminator 914, to measure the characteristics of the input light 112.

Alternatively or in addition, the LIDAR system 100 may include one or more laser transmitter(s) configured to emit electromagnetic radiation 920 of different/multiple wavelengths/frequencies. An optical filter, e.g. a low pass, high pass, band pass or notch filter may select a wavelength/frequency of a plurality of wavelengths/frequencies of a single laser transmitter. This way, by using wavelength multiplexing of spatially parallel optical channels in a PIC 920/waveguide structures 924 of PIC 920, the detrimental effects due to fluctuating targets are mitigated, thus enabling a coherent LIDAR with high optical resolution, high data rate, and long-range detection to be achieved.

A waveguide structure 924 of the PIC 920 may be in the form of a strip line or micro strip line. However, a waveguide structure 924 may also be configured as a planar waveguide. The waveguide structure 924 may be configured to guide electromagnetic radiation emitted from a laser transmitter coupled to the input 904 to the optical output interface Tx. The waveguide structure 924 may be formed from the material of the PIC substrate 902. As an example, at least one waveguide structure 924 may be formed from the PIC substrate 902. Waveguide structures 924 may be optically isolated from each other.

Further, the PIC 920 may include an optical amplifier (SOA) 908 to amplify the light 814, 822 in the waveguide structure 924. In each light path 840-*i*, the photonic integrated circuit 900 may include at least one amplifier structure 908 to amplify the light in the light path to provide an amplified light.

Further illustrated in FIG. 9 is a use of a part of the light from a beam splitter 910 as input signal LO (local oscillator) for the photodetector 912 in the optical channel 840-*i*. Here, the local oscillator determines a difference between the light 814 emitted from the optical output interface Tx of the PIC 920 and light 822 received from the optical input interface Rx at the photodetector 912. The difference may consider temporal fluctuations of the emitted light 814 in the received light 822 for each light path 840-*i* individually, thus allowing the LIDAR system 100 to detect and discriminate the optical frequency of the received light.

In other words, referring to FIG. 1 to FIG. 9, the LIDAR system 100 may include a laser transmitter component 102 and an optical component system 104. The laser transmitter component 102 may include a photonic integrated circuit (PIC) substrate 106. A plurality of laser transmitters 108 coupled to at least one optical output 110 may be formed on the PIC substrate 106.

The laser transmitter component 102 may be configured to emit a light beam 112 from one of the laser transmitters 108 of the plurality of laser transmitters 108 through the at least one optical output 110 one at a time. In other words, only one laser transmitter 108 emits laser light into the scene from the LIDAR system 100 at a time. This way, energy density of the emitted light beam can be limited, e.g. to provide an eye safety provision.

The laser transmitter component 102 may include a feedback circuit 114 configured to determine at least one characteristic of the light beam 112 emitted from the optical output 110. The feedback circuit 114 provides the determined characteristic to a controller 116.

The controller 116 may be configured to control at least one of a temperature and an input electrical current of the laser transmitter 108-1 emitting the light beam 112 emitted from the optical output 110 and to control at least one of a temperature and an input electrical current of at least one further laser transmitter 108-2 of the laser transmitter component 102 based on the determined characteristic corresponding to a predetermined characteristic of the light beam 112 to be emitted from the optical output 110.

The optical component system 104 may be optically coupled to the optical output 110 of the laser transmitter component 102. The optical component system 104 may be configured to determine a signal difference between a light beam 112 transmitted to a scene of the LIDAR system 100, and a light beam 112 received from the scene.

The optical component system 104 may include a plurality of optical channels optically coupled to the optical output 110 of the laser transmitter component 102. The optical component system 104 may include a lens, a grating, and a scanning mirror respectively coupled to the plurality of optical channels. Each of the optical channels may include a photodetector. The photodetector may be coupled to the feedback circuit 114. The determined characteristic may be a characteristic of a local oscillator signal determined with the photodetector. Alternatively, or in addition, the optical component system 104 may include an optical frequency discriminator 914. The measurements from the optical frequency discriminator 914 may be coupled to the feedback circuit and/or controller 304.

One heating device of a plurality of heating devices may be thermally coupled to one laser transmitter 108 of the plurality of laser transmitters 108 respectively. The controller 116 may include a thermal driver circuit configured to control a heat generated by a heating device thermally coupled to the laser transmitter emitting the light through the optical output 110 and the heating device thermally coupled to the at least one further laser transmitter.

The controller 116 may be configured to control the electrical currents input to at least the laser transmitter 108-1 emitting the light through the optical output 110 and input to the at least one further laser transmitter 108-2.

One optical switch of a plurality of optical switches may be arranged between one laser transmitter 108 of the plurality of laser transmitters 108 and the at least one optical output 110 respectively. The optical switches may be optical amplifiers, respectively. The controller 116 may include a switch driver circuit configured to control an optical transmission of the optical switches. Alternatively, or in addition, a single side band (SSB) modulator 120 may be coupled to the at least one optical output 110. The SSB modulator 120 may include a first Mach-Zehnder interferometer (MZI) 122-1 and a second MZI 122-2. The SSB modulator 120 may be configured to provide a frequency chirped signal from the light beam 112 provided from the optical output 110 to an SSB output 124. The optical component system 104 may include a plurality of optical channels optically coupled to the SSB output 124. The SSB modulator 120 may include a bias input 126 coupled to an output 128 of the controller 116 and a monitor output 130 coupled to an input 132 of the feedback circuit 114. Each of the first MZI 122-1 and the second MZI 122-2 respectively includes a bias input 134 coupled to an output 136 of the controller 116 and a monitor output 138 coupled to an input 140 of the feedback circuit 114.

In the following, various examples are provided that may include one or more aspects described above.

Example 1 is a laser transmitter component including a photonic integrated circuit substrate including a plurality of laser transmitters coupled to at least one optical output, the laser transmitter component configured to emit a light beam from one of the laser transmitters of the plurality of laser transmitters through the at least one optical output one laser transmitter at a time; a feedback circuit configured to determine at least one characteristic of the light beam emitted from the optical output and to provide the determined characteristic to a controller; and the controller configured to control at least one of a temperature and an input electrical current of the laser transmitter emitting the light beam emitted from the optical output and to control at least one of a temperature and an input electrical current of at least one further laser transmitter of the laser transmitter component based on the determined characteristic corresponding to a predetermined characteristic of the light beam to be emitted from the optical output.

In Example 2, the subject matter of Example 1 can optionally further include a plurality of optical switches, wherein one optical switch of the plurality of optical switches is arranged between one laser transmitter of the plurality of laser transmitters and the at least one optical output respectively.

In Example 3, the subject matter of Example 2 can optionally include that the optical switches are optical amplifiers, respectively.

In Example 4, the subject matter of any one of Examples 2 to 3 can optionally include that the controller includes a switch driver circuit configured to control an optical transmission of the optical switches.

In Example 5, the subject matter of any one of Examples 1 to 4 can optionally further include a plurality of heating devices, wherein one heating device of the plurality of heating devices is thermally coupled to one laser transmitter of the plurality of laser transmitters respectively.

In Example 6, the subject matter of Example 5 can optionally include that the controller includes a thermal driver circuit configured to control a heat generated by a heating device thermally coupled to the laser transmitter emitting the light through the optical output and the heating device thermally coupled to the at least one further laser transmitter.

In Example 7, the subject matter of any one of Examples 1 to 6 can optionally include that the controller is configured to control the electrical currents input to at least the laser transmitter emitting the light through the optical output and input to the at least one further laser transmitter.

In Example 8, the subject matter of any one of Examples 1 to 7 can optionally include that the feedback circuit includes an optical frequency discriminator configured to detect the characteristic of the light beam output from the optical output.

In Example 9, the subject matter of Example 8 can optionally include that the determined characteristic is phase and frequency fluctuations of the light beam.

In Example 10, the subject matter of any one of Examples 1 to 9 can optionally further include a single side band (SSB) modulator coupled to the at least one optical output, wherein the SSB modulator includes a first Mach-Zehnder interferometer (MZI) and a second MZI, wherein the SSB modulator is configured to provide a frequency chirped signal from the light beam provided from the optical output to an SSB output.

In Example 11, the subject matter of Example 10 can optionally include that the SSB modulator includes a bias input coupled to an output of the controller and a monitor output coupled to an input of the feedback circuit.

In Example 12, the subject matter of any one of Examples 10 to 11 can optionally include that each of the first MZI and the second MZI respectively include a bias input coupled to an output of the controller and a monitor output coupled to an input of the feedback circuit.

Example 13 is a light detection and ranging (LIDAR) system, including: a laser transmitter component including: a photonic integrated circuit substrate including a plurality of laser transmitters coupled to at least one optical output, the laser transmitter component configured to emit a light beam from one of the laser transmitters of the plurality of laser transmitters through the at least one optical output one laser transmitter at a time; a feedback circuit configured to determine at least one characteristic of the light beam emitted from the optical output and to provide the determined characteristic to a controller; and the controller configured to control at least one of a temperature and an input electrical current of the laser transmitter emitting the light beam emitted from the optical output and to control at least one of a temperature and an input electrical current of at least one further laser transmitter of the laser transmitter component based on the determined characteristic corresponding to a predetermined characteristic of the light beam to be emitted from the optical output; the LIDAR system further including an optical component system optically coupled to the output of the laser transmitter component, the optical component system configured to determine a signal difference between a light beam transmitted to a scene of the LIDAR system, and a light beam received from the scene.

In Example 14, the subject matter of Example 13 can optionally include that the optical component system includes a plurality of optical channels optically coupled to the optical output of the laser transmitter component.

In Example 15, the subject matter of Example 14 can optionally include that the optical component system includes a lens, a grating, and a scanning mirror respectively coupled to the plurality of optical channels.

In Example 16, the subject matter of Example 14 to 15 can optionally include that each of the optical channels includes a photodetector.

In Example 17, the subject matter of Example 16 can optionally include that the photodetector is coupled to the feedback circuit.

In Example 18, the subject matter of Example 17 can optionally include that the determined characteristic is a characteristic of a local oscillator signal determined with the photodetector.

In Example 19, the subject matter of any one of Examples 13 to 18 can optionally further include a plurality of optical switches, wherein one optical switch of the plurality of optical switches is arranged between one laser transmitter of the plurality of laser transmitters and the at least one optical output respectively.

In Example 20, the subject matter of Example 19 can optionally include that the optical switches are optical amplifiers, respectively.

In Example 21, the subject matter of any one of Examples 13 to 20 can optionally include that the controller includes a switch driver circuit configured to control an optical transmission of the optical switches.

In Example 22, the subject matter of any one of Examples 13 to 21 can further optionally include a plurality of heating devices, wherein one heating device of the plurality of heating devices is thermally coupled to one laser transmitter of the plurality of laser transmitters respectively.

In Example 23, the subject matter of Example 22 can optionally include that the controller includes a thermal driver circuit configured to control a heat generated by a heating device thermally coupled to the laser transmitter emitting the light through the optical output and the heating device thermally coupled to the at least one further laser transmitter.

In Example 24, the subject matter of any one of Examples 13 to 23 can optionally that the controller is configured to control the electrical currents input to at least the laser transmitter emitting the light through the optical output and input to the at least one further laser transmitter.

In Example 25, the subject matter of any one of Examples 13 to 24 can further optionally include a single side band (SSB) modulator coupled to the at least one optical output, wherein the SSB modulator includes a first Mach-Zehnder interferometer (MZI) and a second MZI, wherein the SSB modulator is configured to provide a frequency chirped signal from the light beam provided from the optical output to an SSB output.

In Example 26, the subject matter of Example 25 can optionally that the optical component system includes a plurality of optical channels optically coupled to the SSB output.

In Example 27, the subject matter of Example 26 can optionally that the optical component system includes a lens, a grating, and a scanning mirror respectively coupled to the plurality of optical channels.

In Example 28, the subject matter of Example 26 or 27 can optionally that each of the optical channels includes a photodetector.

In Example 29, the subject matter of Example 28 can optionally that the photodetector is coupled to the feedback circuit.

In Example 30, the subject matter of Example 29 can optionally that the determined characteristic is a characteristic of a local oscillator signal determined with the photodetector.

In Example 31, the subject matter of any one of Examples 13 to 30 can optionally further include a plurality of optical switches, wherein one optical switch of the plurality of optical switches is arranged between one laser transmitter of the plurality of laser transmitters and the at least one optical output respectively.

In Example 32, the subject matter of Example 31 can optionally include that the optical switches are optical amplifiers, respectively.

In Example 33, the subject matter of any one of Examples 31 to 32 can optionally include that the controller includes a switch driver circuit configured to control an optical transmission of the optical switches.

In Example 34, the subject matter of any one of Examples 13 to 34 can optionally further include a plurality of heating devices, wherein one heating device of the plurality of heating devices is thermally coupled to one laser transmitter of the plurality of laser transmitters respectively.

In Example 35, the subject matter of Example 34 can optionally further include that the controller includes a thermal driver circuit configured to control a heat generated by a heating device thermally coupled to the laser transmitter emitting the light through the optical output and the heating device thermally coupled to the at least one further laser transmitter.

In Example 36, the subject matter of any one of Examples 13 to 35 can optionally further include that the controller is configured to control the electrical currents input to at least the laser transmitter emitting the light through the optical output and input to the at least one further laser transmitter.

In Example 37, the subject matter of any one of Examples 25 to 36 can optionally include that the SSB modulator includes a bias input coupled to an output of the controller and a monitor output coupled to an input of the feedback circuit.

In Example 38, the subject matter of any one of Examples 25 to 37 can optionally include that each of the first MZI and the second MZI respectively include a bias input coupled to an output of the controller and a monitor output coupled to an input of the feedback circuit.

Example 38 is a laser transmitting component means including a photonic integrated circuit substrate including a plurality of laser transmitting means coupled to at least one optical output means, the laser transmitting component means for emitting a light beam from one of the laser transmitting means of the plurality of laser transmitting means through the at least one optical output means one at a time; a feedback means for determining at least one characteristic of the light beam emitted from the optical output means and to provide the determined characteristic to a controlling means; and the controlling means for controlling at least one of a temperature and an input electrical current of the laser transmitting means emitting the light beam emitted from the optical output means and to control at least one of a temperature and an input electrical current of at least one further laser transmitting means of the laser transmitter component means based on the determined characteristic corresponding to a predetermined characteristic of the light beam to be emitted from the optical output means.

In Example 39, the subject matter of Example 38 can optionally further include a plurality of optical switching means, wherein one optical switching means of the plurality of optical switching means is arranged between one laser transmitting means of the plurality of laser transmitting means and the at least one optical output means respectively.

In Example 40, the subject matter of Example 39 can optionally include that the optical switching means are optical amplification means, respectively.

In Example 41, the subject matter of Example 38 or 39 can optionally further include that the controlling means includes a switch driving means for controlling an optical transmission of the optical switching means.

In Example 42, the subject matter of any one of Examples 38 to 41 can optionally further include a plurality of heating means, wherein one heating means of the plurality of heating means is thermally coupled to one laser transmitting means of the plurality of laser transmitting means respectively.

In Example 43, the subject matter of Example 42 can optionally further include that the controlling means includes a thermal driving means for controlling a heat generated by a heating means thermally coupled to the laser transmitting means emitting the light through the optical output means and the heating means thermally coupled to the at least one further laser transmitting means.

In Example 44, the subject matter of Example 38 can optionally include that the controlling means is for controlling the electrical currents input to at least the laser transmitting means emitting the light through the optical output means and input to the at least one further laser transmitting means.

In Example 45, the subject matter of any one of Examples 38 to 44 can optionally include that the feedback means includes a photo detecting means for detecting the characteristic of the light beam output from the optical output means.

In Example 46, the subject matter of any one of Examples 38 to 45 can optionally include that the determined characteristic is a characteristic of a local oscillator signal determined with the photo detecting means.

In Example 47, the subject matter of any one of Examples 38 to 44 can optionally further include a single side band (SSB) modulating means coupled to the at least one optical output means, wherein the SSB modulating means includes a first Mach-Zehnder interferometer (MZI) means and a second MZI means, wherein the SSB modulating means is for providing a frequency chirped signal from the light beam provided from the optical output means to an SSB output means.

In Example 48, the subject matter of Example 47 can optionally include that the SSB modulator includes a bias input means coupled to an output means of the controller and a monitor output means coupled to an input means of the feedback means.

In Example 49, the subject matter of Examples 47 to 48 can optionally include that each of the first MZI means and the second MZI means respectively include a bias input means coupled to an output means of the controlling means and a monitor output means coupled to an input means of the feedback means.

Example 50 is a vehicle including a LIDAR system of any of Example 13 to 49.

In Example 51, the subject matter of Example 50 can optionally include that the LIDAR system is an obstacle detection of the vehicle.

Example 52 is non-transitory computer readable medium having instructions stored therein that, when executed by one or more processors, cause the one or more processors to determine at least one characteristic of a light beam emitted from an optical output of a laser transmitter component using a feedback circuit of the laser transmitter component, the laser transmitter component including a plurality of laser transmitters on a photonic integrated circuit substrate and coupled to at least one optical output, the laser transmitter component configured to emit a light beam from one of the laser transmitters of the plurality of laser transmitters through the at least one optical output one laser transmitter at a time; and the feedback circuit configured to determine at least one characteristic of the light beam emitted from the optical output and to provide the determined characteristic to a controller; determine, using the controller, a characteristics deviation between the determined characteristic and a predefined characteristic, control, using the controller, at least one of a temperature and an input electrical current of the laser transmitter emitting the light beam emitted from the optical output based on the determined characteristics deviation, and control, using the controller, at least one of a temperature and an input electrical current of at least one further laser transmitter of the laser transmitter component based on the determined characteristic corresponding to a predetermined characteristic of the light beam to be emitted from the optical output.

In Example 53, the subject matter of Example 52 can optionally include that the controller includes a switch driver circuit configured to control an optical transmission of optical switches arranged between the laser transmitters and the at least one optical output respectively.

In Example 54, the subject matter of any one of Examples 52 to 53 can optionally include that the controller includes a thermal driver circuit configured to control a heat generated by a heating device thermally coupled to the laser transmitter emitting the light through the optical output and the heating device thermally coupled to the at least one further laser transmitter.

In Example 55, the subject matter of any one of Examples 52 to 54 can optionally include that the controller is configured to control the electrical currents input to at least the laser transmitter emitting the light through the optical output and input to the at least one further laser transmitter.

In Example 56, the subject matter of any one of Examples 52 to 55 can further optionally include a single side band (SSB) modulator coupled to the at least one optical output, wherein the SSB modulator includes a first Mach-Zehnder interferometer (MZI) and a second MZI, wherein the SSB modulator is configured to provide a frequency chirped signal from the light beam provided from the optical output to an SSB output.

In Example 57, the subject matter of any one of Examples 52 to 56 can optionally include that the optical component system includes a plurality of optical channels optically coupled to the SSB output.

In Example 58, the subject matter of Example 57 can optionally include that each of the optical channels includes a photodetector.

In Example 59, the subject matter of Example 58 can optionally include that the photodetector is coupled to the feedback circuit.

In Example 60, the subject matter of Example 59 can optionally include that the determined characteristic is a characteristic of a local oscillator signal determined with the photodetector.

In Example 61, the subject matter of any one of Examples 56 to 60 can optionally include that the SSB modulator includes a bias input coupled to an output of the controller and a monitor output coupled to an input of the feedback circuit.

In Example 62, the subject matter of any one of Examples 56 to 61 can optionally include that each of the first MZI and the second MZI respectively include a bias input coupled to an output of the controller and a monitor output coupled to an input of the feedback circuit.

In Example 63, the subject matter of any one of Example 1 to 62 can optionally include that the controller measures monitoring outputs only during the time when a specific one of the optical transmitters emits light, and the controller sets bias value(s) of bias input(s) corresponding to the monitored outputs.

The word “exemplary” is used herein to mean “serving as an example, instance, or illustration.” Any example or design described herein as “exemplary” is not necessarily to be construed as preferred or advantageous over other examples or designs.

The words “plurality” and “multiple” in the description or the claims expressly refer to a quantity greater than one. The terms “group (of)”, “set [of]”, “collection (of)”, “series (of)”, “sequence (of)”, “grouping (of)”, etc., and the like in the description or in the claims refer to a quantity equal to or greater than one, i.e. one or more. Any term expressed in plural form that does not expressly state “plurality” or “multiple” likewise refers to a quantity equal to or greater than one.

The terms “processor” or “controller” as, for example, used herein may be understood as any kind of technological entity that allows handling of data. The data may be handled according to one or more specific functions that the processor or controller execute. Further, a processor or controller as used herein may be understood as any kind of circuit, e.g., any kind of analog or digital circuit. A processor or a controller may thus be or include an analog circuit, digital circuit, mixed-signal circuit, logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit (ASIC), etc., or any combination thereof. Any other kind of implementation of the respective functions may also be understood as a processor, controller, or logic circuit. It is understood that any two (or more) of the processors, controllers, or logic circuits detailed herein may be realized as a single entity with equivalent functionality or the like, and conversely that any single processor, controller, or logic circuit detailed herein may be realized as two (or more) separate entities with equivalent functionality or the like.

The term "connected" can be understood in the sense of a (e.g. mechanical and/or electrical), e.g. direct or indirect, connection and/or interaction. For example, several elements can be connected together mechanically such that they are physically retained (e.g., a plug connected to a socket) and electrically such that they have an electrically conductive path (e.g., signal paths exist along a communicative chain).

While the above descriptions and connected figures may depict electronic device components as separate elements, skilled persons will appreciate the various possibilities to combine or integrate discrete elements into a single element. Such may include combining two or more circuits from a single circuit, mounting two or more circuits onto a common chip or chassis to form an integrated element, executing discrete software components on a common processor core, etc. Conversely, skilled persons will recognize the possibility to separate a single element into two or more discrete elements, such as splitting a single circuit into two or more separate circuits, separating a chip or chassis into discrete elements originally provided thereon, separating a software component into two or more sections and executing each on a separate processor core, etc. Also, it is appreciated that particular implementations of hardware and/or software components are merely illustrative, and other combinations of hardware and/or software that perform the methods described herein are within the scope of the disclosure.

It is appreciated that implementations of methods detailed herein are exemplary in nature, and are thus understood as capable of being implemented in a corresponding device. Likewise, it is appreciated that implementations of devices detailed herein are understood as capable of being implemented as a corresponding method. It is thus understood that a device corresponding to a method detailed herein may include one or more components configured to perform each aspect of the related method.

All acronyms defined in the above description additionally hold in all claims included herein.

While the disclosure has been particularly shown and described with reference to specific embodiments, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

What is claimed is:

1. A laser transmitter component comprising:

a photonic integrated circuit substrate comprising a plurality of laser transmitters coupled to at least one optical output, the laser transmitter component configured to emit a light beam from one of the laser transmitters of the plurality of laser transmitters through the at least one optical output one laser transmitter at a time;

a plurality of optical switches, each one arranged between a respective one of the plurality of laser transmitters and the at least one optical output and couples the respective one of the plurality of laser transmitters to the at least one optical output; and a feedback circuit configured to determine at least one characteristic of the light beam emitted from the optical output and to provide the determined characteristic to a controller, wherein;

the controller is configured to control at least one of a temperature and an input electrical current of the laser transmitter emitting the light beam emitted from the optical output and to control at least one of a temperature and an input electrical current of at least one further laser transmitter of the laser transmitter component based on the determined characteristic corresponding to a predetermined characteristic of the light beam to be emitted from the optical output.

2. The laser transmitter component of claim 1, wherein the feedback circuit comprises an optical frequency discriminator configured to detect the characteristic of the light beam output from the optical output.

3. The laser transmitter component of claim 1, wherein the controller is configured to control the electrical currents input to at least the laser transmitter emitting the light through the optical output and input to the at least one further laser transmitter.

4. The laser transmitter component of claim 1, further comprising a single side band (SSB) modulator coupled to the at least one optical output, wherein the SSB modulator comprises a first Mach-Zehnder interferometer (MZI) and a second MZI, wherein the SSB modulator is configured to provide a frequency chirped signal from the light beam provided from the optical output to an SSB output.

5. The laser transmitter component of claim 4, wherein the SSB modulator comprises a bias input coupled to an output of the controller and a monitor output coupled to an input of the feedback circuit.

6. The laser transmitter component of claim 4, wherein each of the first MZI and the second MZI respectively comprises a bias input coupled to an output of the controller and a monitor output coupled to an input of the feedback circuit.

7. A light detection and ranging (LIDAR) system, comprising:

a laser transmitter component and an optical component system, wherein the laser transmitter component comprises:

a photonic integrated circuit substrate comprising a plurality of laser transmitters coupled to at least one optical output, the laser transmitter component configured to emit a light beam from one of the laser transmitters of the plurality of laser transmitters through the at least one optical output one laser transmitter at a time;

a feedback circuit configured to determine at least one characteristic of the light beam emitted from the optical output and to provide the determined characteristic to a controller, wherein the controller is configured to control a plurality of optical switches, each one arranged between a respective one of the plurality of laser transmitters and the at least one optical output and couples the respective one of the plurality of laser transmitters to the at least one optical output; and the controller configured to control at least one of a temperature and an input electrical current of the laser transmitter emitting the light beam emitted from the optical output and to control at least one of a temperature and an input electrical current of at least one further laser transmitter of the laser transmitter component based on the determined characteristic corresponding to a predetermined characteristic of the light beam to be emitted from the optical output, wherein the optical component system is optically coupled to the output of the laser transmitter component and is configured to determine a signal difference between a light beam transmitted to a scene of the LIDAR system; and a light beam received from the scene.

8. The LIDAR system of claim 7, wherein the optical component system comprises a plurality of optical channels optically coupled to the optical output of the laser transmitter component.

9. The LIDAR system of claim 8, wherein the optical component system comprises a lens, a grating, and a scanning mirror respectively coupled to the plurality of optical channels.

10. The LIDAR system of claim 7, further comprising a plurality of heating devices, wherein one heating device of the plurality of heating devices is thermally coupled to one laser transmitter of the plurality of laser transmitters respectively.

11. The LIDAR system of claim 10, wherein the controller comprises a thermal driver circuit configured to control a heat generated by a heating device thermally coupled to the laser transmitter emitting the light through the optical output and the heating device thermally coupled to the at least one further laser transmitter.

12. The LIDAR system of claim 7, wherein the controller is configured to control the electrical currents input to at least the laser transmitter emitting the light through the optical output and input to the at least one further laser transmitter.

13. The LIDAR system of claim 7, further comprising a single side band (SSB) modulator coupled to the at least one optical output, wherein the SSB modulator comprises a first Mach-Zehnder interferometer (MZI) and a second MZI, wherein the SSB modulator is configured to provide a frequency chirped signal from the light beam provided from the optical output to an SSB output.

14. The LIDAR system of claim 13, wherein the optical component system comprises a plurality of optical channels optically coupled to the SSB output.

15. The LIDAR system of claim 13, wherein the SSB modulator comprises a bias input coupled to an output of the controller and a monitor output coupled to an input of the feedback circuit.

16. The LIDAR system of claim 13, wherein each of the first MZI and the second MZI respectively comprise a bias input coupled to an output of the controller and a monitor output coupled to an input of the feedback circuit.

17. A non-transitory computer readable medium having instructions stored therein that, when executed by one or more processors, cause the one or more processors to:

determine at least one characteristic of a light beam emitted from an optical output of a laser transmitter component using a feedback circuit of the laser transmitter component, the laser transmitter component comprising a plurality of laser transmitters on a photonic integrated circuit substrate and coupled to at least one optical output, the laser transmitter component configured to emit a light beam from one of the laser transmitters of the plurality of laser transmitters through the at least one optical output one laser transmitter at a time, wherein the laser transmitter component further comprises a plurality of optical switches, each one arranged between a respective one of the plurality of laser transmitters to the at least one optical output to couple the respective one of the plurality of laser transmitters to the at least one optical output;

determine, using the feedback circuit, at least one characteristic of the light beam emitted from the optical output and to provide the determined characteristic to a controller, wherein the controller comprises a switch driver circuit configured to control a plurality of optical switches, each one arranged between a respective one of the plurality of laser transmitters and the at least one optical output and couples the respective one of the plurality of laser transmitters to the at least one optical output;

determine, using the controller, a characteristics deviation between the determined characteristic and a predefined characteristic; and control, using the controller, at least one of a temperature and an input electrical current of the laser transmitter emitting the light beam emitted from the optical output based on the determined characteristics deviation, and control, using the controller, at least one of a temperature and an input electrical current of at least one further laser transmitter of the laser transmitter component based on the determined characteristic corresponding to a predetermined characteristic of the light beam to be emitted from the optical output.

18. The non-transitory computer readable medium of claim 17, further comprising a single side band (SSB) modulator coupled to the at least one optical output, wherein the SSB modulator comprises a first Mach-Zehnder interferometer (MZI) and a second MZI, wherein the SSB modulator is configured to provide a frequency chirped signal from the light beam provided from the optical output to an SSB output.

* * * * *